United States Patent
Yokobayashi et al.

(10) Patent No.: US 8,860,067 B2
(45) Date of Patent: Oct. 14, 2014

(54) SEMICONDUCTOR LIGHT EMITTING DEVICE

(75) Inventors: Yusuke Yokobayashi, Tokyo (JP); Satoshi Tanaka, Tokyo (JP); Tatsuma Saito, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 265 days.

(21) Appl. No.: 13/311,050

(22) Filed: Dec. 5, 2011

(65) Prior Publication Data

US 2012/0146086 A1    Jun. 14, 2012

(30) Foreign Application Priority Data

Dec. 8, 2010 (JP) ................. 2010-273843

(51) Int. Cl.
*H01L 33/62* (2010.01)
*H01L 33/14* (2010.01)
*H01L 33/20* (2010.01)
*H01L 33/38* (2010.01)

(52) U.S. Cl.
CPC .............. *H01L 33/20* (2013.01); *H01L 33/14* (2013.01); *H01L 33/382* (2013.01)
USPC ................. 257/99; 257/13; 257/81; 257/91; 257/E33.062; 257/E33.065; 257/E33.067

(58) Field of Classification Search
CPC ..... H01L 33/14; H01L 33/145; H01L 33/382; H01L 33/385
USPC .............. 257/13, 79, 81, 91, 99, 98, E33.001, 257/E33.062, E33.066, E33.067, E33.065; 438/22

See application file for complete search history.

(56) References Cited

U.S. PATENT DOCUMENTS 7,276,742 B2 * 10/2007 Kohno et al. ................. 257/103
2010/0019258 A1 * 1/2010 Kang et al. ...................... 257/96

FOREIGN PATENT DOCUMENTS

JP         11-220171        8/1999

* cited by examiner

*Primary Examiner* — Ermias Woldegeorgis
(74) *Attorney, Agent, or Firm* — Holtz, Holtz, Goodman & Chick PC

(57) ABSTRACT

A semiconductor light emitting device having an n-electrode and a p-electrode provided on the same surface side of a semiconductor film, wherein current spread in the semiconductor film is promoted, so that the improvements in luminous efficiency and reliability, the emission intensity uniformalization across the surface, and a reduction in the forward voltage, can be achieved. The semiconductor light emitting device includes a semiconductor film including an n-type semiconductor layer, an active layer, and a p-type semiconductor layer; the n-electrode formed on an exposed surface of the n-type semiconductor layer exposed by removing parts of the p-type semiconductor layer, of the active layer, and of the n-type semiconductor layer with accessing from the surface side of the p-type semiconductor layer; and the p-electrode. A current guide portion having conductivity higher than that of the n-type semiconductor layer is provided on or in the n-type semiconductor layer over the p-type electrode.

18 Claims, 10 Drawing Sheets

SEMICONDUCTOR LIGHT EMITTING DEVICE

BACKGROUND OF THE INVENTION

1. Field of the Invention

The present invention relates to a semiconductor light emitting device and particularly to a so-called flip-chip-type semiconductor light emitting device having an n-electrode and a p-electrode provided on the same surface side of a semiconductor film.

2. Description of the Related Art

FIG. 1 is a cross-sectional view showing the configuration of a conventional flip-chip-type semiconductor light emitting device 100. The semiconductor light emitting device 100 has a semiconductor film 120 formed on a surface of a growth substrate 110 and composed of an n-type semiconductor layer 122, an active layer 124, and a p-type semiconductor layer 126. A p-electrode 132 is formed to cover almost the entire area of the p-type semiconductor layer 126. An n-electrode 134 is formed on an exposed surface of the n-type semiconductor layer 122 exposed by removing parts of the p-type semiconductor layer 126, of the active layer 124, and of the n-type semiconductor layer 122 with accessing from the surface side of the p-type semiconductor layer 126. That is, the p-electrode 132 and the n-electrode 134 are provided on the same surface side of the semiconductor film 120. A protective film 140 is made of an insulator such as $SiO_2$ and covers the side surfaces of the semiconductor film 120 and the side surfaces of the p-electrode 132 and of the n-electrode 134 to prevent shorting due to the sticking of electrode material or solder material used in mounting.

In the semiconductor light emitting device 100, the surface on the side where the p-electrode 132 and the n-electrode 134 are formed is a mounting surface, and the surface on the side where the growth substrate 110 is formed is a light emitting surface. In FIG. 1, the semiconductor light emitting device 100 is mounted on a mounting substrate 200. The p-electrode 132 and the n-electrode 134 are respectively connected via solder material 220 to conductor lines 210 formed on the mounting substrate 200. In FIG. 1, current flowing through the semiconductor film 120 is indicated by broken lines.

For example, Patent Literature 1 discloses a flip-chip-type semiconductor light emitting device having a GaN-based semiconductor film.

CITATION LIST

Patent Literature 1: Japanese Patent Kokai No. H11-220171

SUMMARY OF THE INVENTION

In the semiconductor light emitting device 100 as shown in FIG. 1, because of an electrode arrangement where the p-electrode 132 and the n-electrode 134 are formed on the same surface side of the semiconductor film 120, the distance between both the electrodes varies. Namely, in the p-electrode 132 there are parts which are close to and far from the n-electrode 134. Immediately under the p-electrode, the current density is higher at positions relatively close to the n-electrode 134 and decreases as the distance to the n-electrode 134 increases. As a result, so-called brightness unevenness occurs in which emission intensity is uneven in the light emitting surface. Further, luminous efficiency is reduced because the contribution by regions of low current density to light emission is small.

Meanwhile, the p-type semiconductor layer 126 is relatively thin in thickness and inferior in crystallinity to the n-type semiconductor layer 122. Hence, the crystal destruction may occur in a region of high current density. Further, in the region of high current density, migration in metal forming the p-electrode 132 is more likely to occur, resulting in a short circuit or the like.

In the flip-chip-type semiconductor light emitting device, current flows through the semiconductor film 120 mainly in a direction (lateral direction) parallel to the principal surface of the semiconductor film 120. In order to reduce the forward voltage of the semiconductor light emitting device 100, the thickness of the semiconductor film 120 (especially the thickness of the n-type semiconductor layer 122) needs to be increased to reduce the sheet resistance of the semiconductor film 120. However, the current does not spread sufficiently in the lamination direction of the semiconductor film 120 because of the electrode arrangement, but flows through the surface layer near the active layer 124. Thus, the effective sheet resistance of the semiconductor film 120 is high. As such, in the flip-chip-type semiconductor light emitting device, it is difficult to control the sheet resistance by means of the thickness of the semiconductor film, and it is not easy to lower the forward voltage.

Moreover, in the flip-chip-type semiconductor light emitting device, part of the active layer 124 needs to be removed to form the n-electrode 134. The area of the n-electrode 134 is preferably as small as possible from the viewpoint of securing the area of the light emitting portion. However, if the area of the n-electrode 134 is reduced, then the current density immediately under the n-electrode 134 increases, resulting in heat generated by this being excessive. As a result, the crystal destruction of the semiconductor film 120 or the peeling-off of the protective film 140 is caused, resulting in a reduction in reliability. That is, in the conventional flip-chip-type semiconductor light emitting device, the area of the n-electrode needs to be secured at the expense of the area of the light emitting portion.

The present invention has been made in view of the above facts, and an object thereof is to provide a semiconductor light emitting device having an n-electrode and a p-electrode provided on the same surface side of the semiconductor film, wherein current spread in the lateral direction and the lamination direction in the semiconductor film is promoted, so that the improvement in luminous efficiency, the emission intensity uniformalization across the surface, a reduction in the forward voltage, and an improvement in reliability can be achieved.

According to the present invention, there is provided a semiconductor light emitting device which includes a semiconductor film including a first semiconductor layer of a first conductivity type, a second semiconductor layer of a second conductivity type, and an active layer provided between the first semiconductor layer and the second semiconductor layer; a first electrode formed on an exposed surface of the first semiconductor layer exposed by removing parts of the second semiconductor layer, of the active layer, and of the first semiconductor layer with accessing from the surface side of the second semiconductor layer; and a second electrode formed on the surface of the second semiconductor layer. The semiconductor light emitting device comprises a current guide portion provided on or in the first semiconductor layer over the second electrode and having conductivity higher than that of the first semiconductor layer.

According to the present invention, in the semiconductor light emitting device having an n-electrode and a p-electrode provided on the same surface side of a semiconductor film, current spread in the lateral direction and the lamination direction in the semiconductor film is promoted, and thus the improvement in luminous efficiency, the emission intensity uniformalization across the surface, a reduction in the forward voltage, and an improvement in reliability can be achieved.

DETAILED DESCRIPTION OF THE INVENTION

Figure 1:
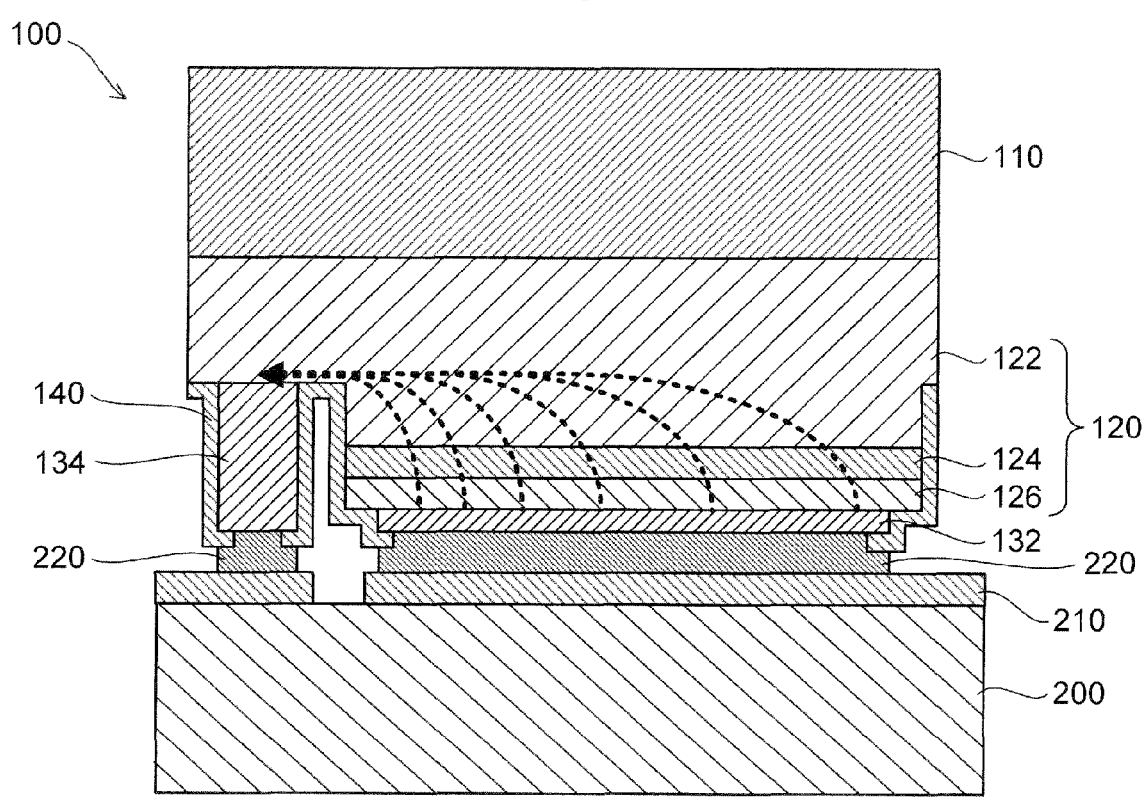
FIG. 1 is a cross-sectional view showing the configuration of a conventional flip-chip-type semiconductor light emitting device.

Embodiments of the present invention will be described below with reference to the accompanying drawings. In the figures cited below, the same reference numerals are used to denote substantially the same or equivalent constituents or parts.

Embodiment 1

Figure 2A:
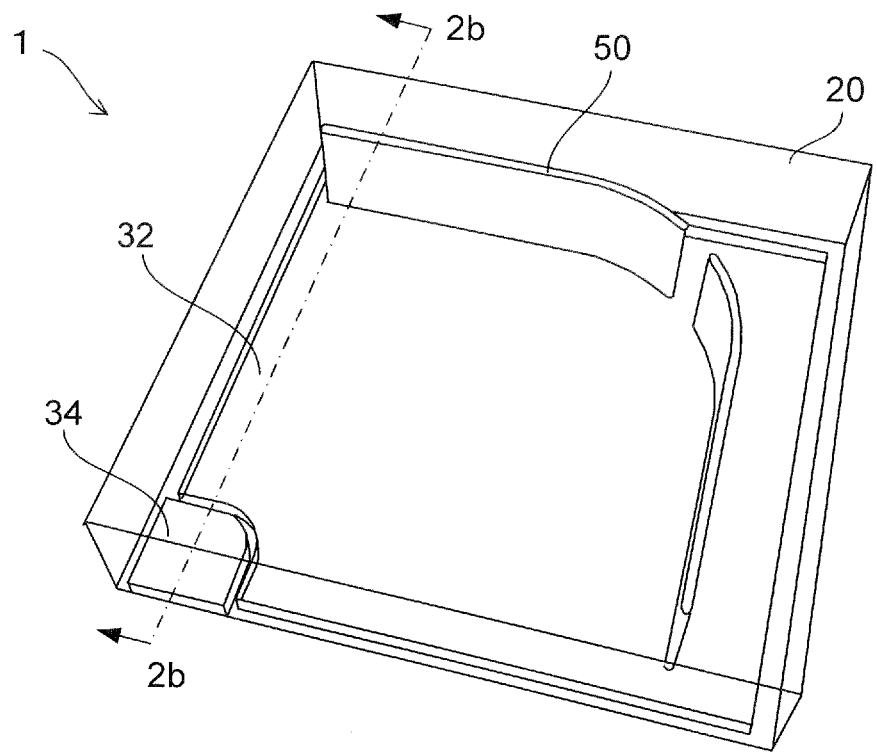
FIG. 2A is a perspective view showing the configuration of a semiconductor light emitting device according to Embodiment 1 of the present invention.
Figure 2B:
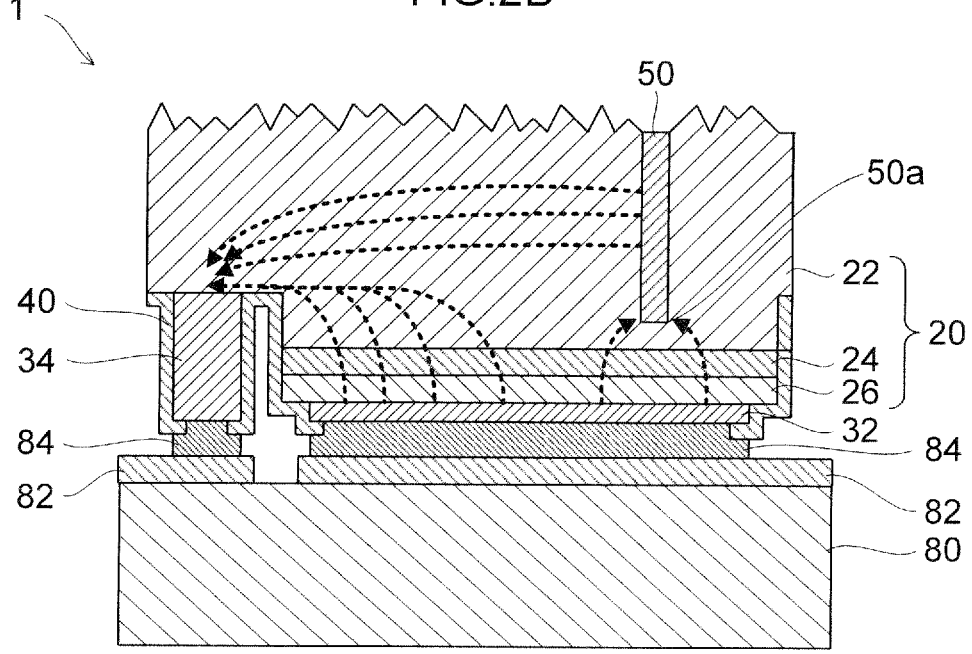
FIG. 2B is a cross-sectional view taken along line 2b-2b in FIG. 2A.

FIG. 2A is a perspective view showing the internal structure of a semiconductor light emitting device 1 according to Embodiment 1 of the present invention, and FIG. 2B is a cross-sectional view taken along line 2b-2b in FIG. 2A. Note that FIG. 2B shows a state where the semiconductor light emitting device 1 is mounted on a support substrate 80 having conductor lines 82 thereon. The semiconductor light emitting device 1 is a so-called flip-chip-type light emitting diode (LED) having a p-electrode 32 and an n-electrode 34 provided on the same surface side of a semiconductor film 20. The semiconductor light emitting device 1 has a semiconductor film 20 including an n-type semiconductor layer 22, an active layer 24, and a p-type semiconductor layer 26, which are made of, e.g., GaN-based semiconductors. The p-electrode 32 is formed to cover almost the entire area of the p-type semiconductor layer 26. The n-electrode 34 is formed on a surface of the n-type semiconductor layer 22 exposed by removing parts of the p-type semiconductor layer 26, of the active layer 24, and of the n-type semiconductor layer 22 with accessing from the surface side of the p-type semiconductor layer 26. The n-electrode 34 is placed in a corner of the semiconductor film 20 having, e.g., a rectangular shape. A protective film 40 is made of an insulator such as $SiO_2$ and covers the side surfaces of the semiconductor film 20 and the side surfaces of the p-electrode 32 and of the n-electrode 34 to prevent shorting due to the sticking of electrode material or solder material used in mounting.

In the semiconductor light emitting device 1, the surface on the side where the p-electrode 32 and the n-electrode 34 are formed is a mounting surface, and the surface of the n-type semiconductor layer 22 is a light emitting surface. The p-electrode 32 and the n-electrode 34 are respectively connected via solder material 84 to conductor lines 82 formed on the support substrate 80 made of an insulator. The growth substrate used for the crystal growth of the semiconductor film 20 has been removed so that the surface of the n-type semiconductor layer 22 is exposed. As shown in FIG. 2B, irregularities to improve light extraction efficiency may be formed in the exposed surface of the n-type semiconductor layer 22 exposed by removing the growth substrate.

A current guide portion 50 is provided being buried in the n-type semiconductor layer 22. The current guide portion 50 extends from the surface of the n-type semiconductor layer 22 that is the light emitting surface of the semiconductor light emitting device 1 in the lamination direction (thickness direction) of the semiconductor film 20 and terminates at a depth not reaching the active layer 24 and the p-type semiconductor layer 26. The current guide portion 50 is provided, in a direction parallel to the principal surface of the semiconductor film 20, over the p-electrode 32 exclusively on its end side far from the n-electrode 34. That is, the current guide portion 50 is placed in a region relatively low in current density above the p-electrode 32.

The current guide portion 50 is constituted by a conductor having conductivity higher than that of the n-type semiconductor layer 22. Specifically, the current guide portion 50 is formed of any of general metal, In, Sn, and Zn, or an oxide conductor including some of them, or so on. The current guide portion 50 is preferably formed of a material high in optical reflectance or optical transmittance to the light emission wavelength of the semiconductor light emitting device 1 in terms of light extraction efficiency. For example, metal such as Ag, Al, Pt, or Rh, or an alloy including these can be cited as the material high in optical reflectance. In contrast, a transparent oxide conductor such as ITO (Indium Tin Oxide) or IZO (Indium Zinc Oxide), or AuNi alloy, or so on can be cited as the material high in optical transmittance. The current guide portion 50 is preferably made of a material low in contact resistance (i.e., forming ohmic contact) with the n-type semiconductor layer 22. Because the n-type semiconductor layer 22 is relatively likely to form ohmic contact, no problem occurs when the above material is used. In order to reduce contact resistance more reliably, the surface of the current guide portion 50 may be covered with a metal thin film made of Ti, Ni or the like of about 2 to 15 Å thickness. In this case, not only the effect of reducing contact resistance but also the effect of improving adhesion between the current guide portion 50 and the semiconductor film 20 can be expected.

In FIG. 2B, current flowing through the semiconductor film 20 is indicated by broken lines. Current injected from the p-electrode 32 into the semiconductor film 20 flows directly toward the n-electrode 34 from the p-electrode 32 at regions near the n-electrode 34. Meanwhile, at regions relatively far from the n-electrode 34, current flows toward the n-electrode 34 via the current guide portion 50 higher in conductivity than the n-type semiconductor layer 22 or a region having conductivity substantially increased by the introduction of the current guide portion 50. By placing the current guide portion 50 directly under part of the p-electrode 32 near its end farthest from the n-electrode 34, current flowing through the region relatively far from the n-electrode 34 is led into the current guide portion 50, so that the amount of current in this region can be increased. That is, the current density of the region where, in the conventional flip-chip-type semiconductor light emitting device, the current density is low can be increased. By this means, current spread in a direction (lateral direction) parallel to the principal surface of the semiconductor film 20 is promoted, and in addition the current density in the semiconductor film 20 is made uniform, resulting in an improvement in luminous efficiency and an improvement in the emission intensity uniformity across the light emitting surface. Further, because current flows toward the n-electrode 34 via the current guide portion 50 extending in the lamination direction of the semiconductor film 20, current spread in the lamination direction of the semiconductor film 20 is promoted, so that a reduction in the forward voltage can be achieved. As such, in the semiconductor light emitting device according to the present embodiment, current spread in the lateral direction and the lamination direction is promoted so as to suppress the lopsided distribution of the current density, and hence the crystal destruction and the migration of the electrode material can be prevented.

The end 50a of the current guide portion 50 in the lamination direction of the semiconductor film 20 is preferably located at a depth position closer to the active layer 24 than the depth position of the interface between the n-electrode 34 and the n-type semiconductor layer 22. By making the current guide portion 50 be adjacent to the p-electrode 32, the amount of current led into the current guide portion 50 increases, and thus the current spread can be promoted. Further, as shown in FIG. 2A, the current guide portion 50 preferably extends also in a direction (lateral direction) parallel to the principal surface of the semiconductor film 20. By this means, the current spread across the wide area of the semiconductor film 20 can be promoted, and thus the effective area of the light emitting portion can be enlarged and the luminous efficiency can be further improved. In this case, by making the distance from each part of the current guide portion 50 to the n-electrode 34 be substantially the same, that is, making the extending direction of the current guide portion 50 be parallel to the outer side edge of the n-electrode 34, potential becomes uniform across the parts of the current guide portion 50, and thus the lopsidedness of the current density distribution in the semiconductor film 20 can be prevented. Note that the current guide portion 50 extending in the direction (lateral direction) parallel to the principal surface of the semiconductor film 20 may be discontinuous along the extending direction. That is, the current guide portion 50 may be divided into a plurality of segments along the direction (lateral direction) parallel to the principal surface of the semiconductor film 20. By this means, the area of the current guide portion 50 that blocks light emitted from the active layer 24 is made smaller, and thus the light extraction efficiency can be improved.

Although in the above embodiment the current guide portion 50 is buried in the n-type semiconductor layer 22, the current guide portion 50 may be formed on the surface of the n-type semiconductor layer 22 that is the light emitting surface. Also in this case, part of the n-type semiconductor layer 22 near the current guide portion 50 becomes higher in conductivity, and hence the effect of some extent can be obtained.

Figure 3A:
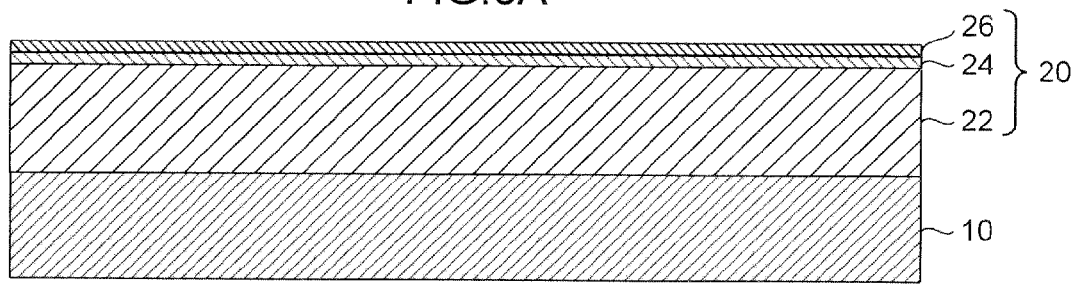
FIGS. 3A to 3D are cross-sectional views showing a manufacturing method of the semiconductor light emitting device according to the embodiment of the present invention.
Figure 3B:
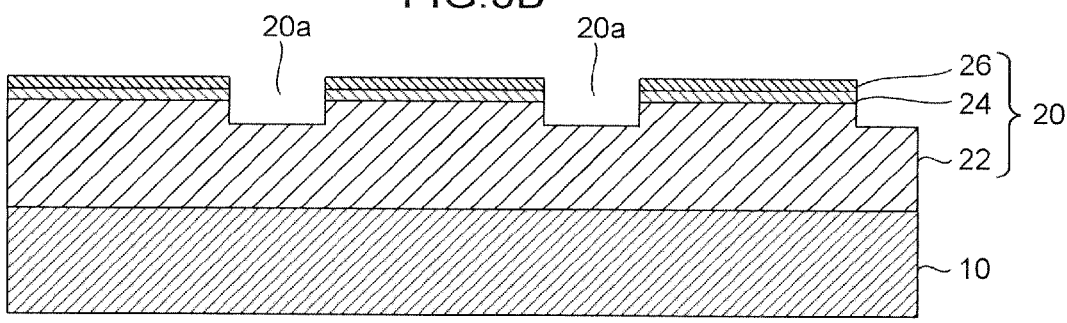
Figure 3C:
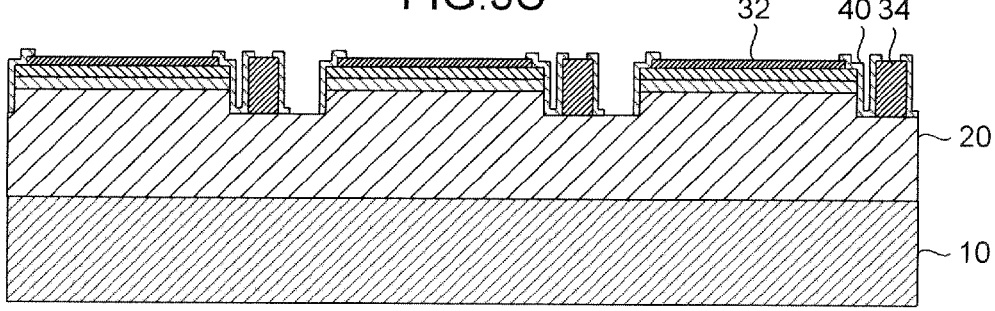
Figure 3D:
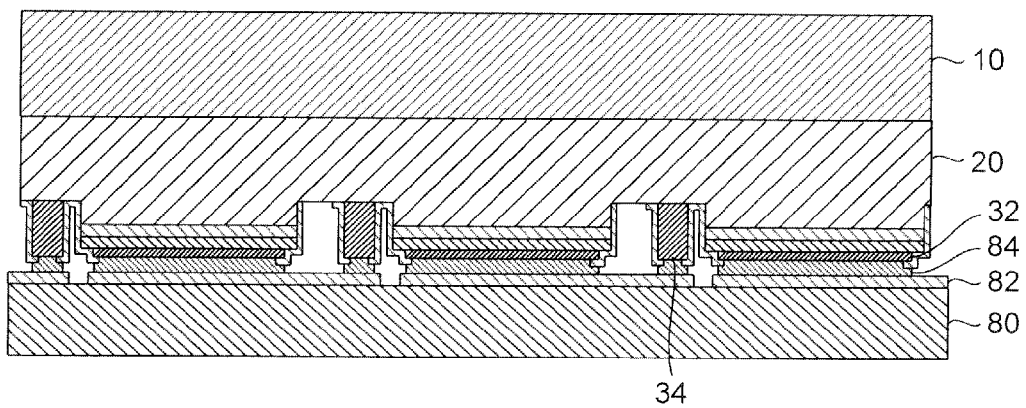
Figure 4A:
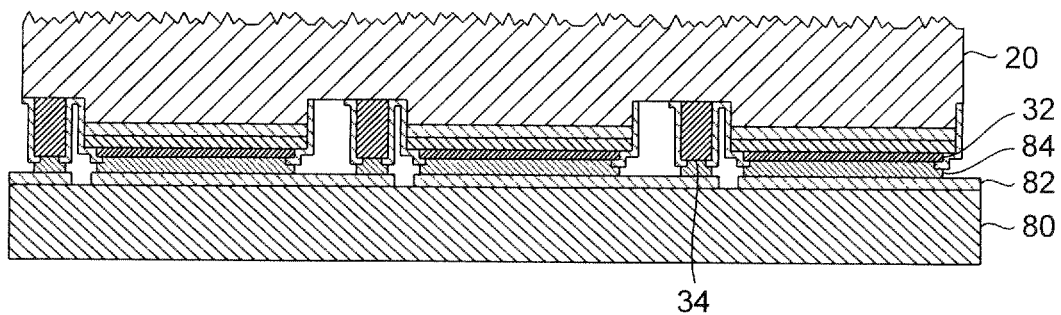
FIGS. 4A to 4C are cross-sectional views showing the manufacturing method of the semiconductor light emitting device according to the embodiment of the present invention.
Figure 4B:
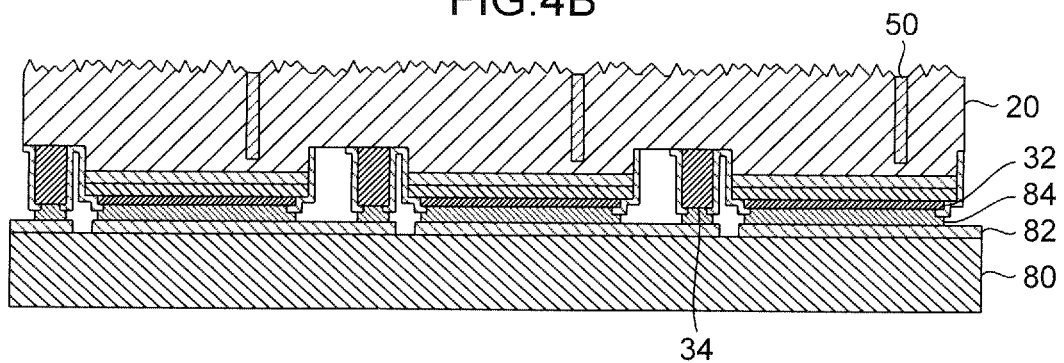
Figure 4C:
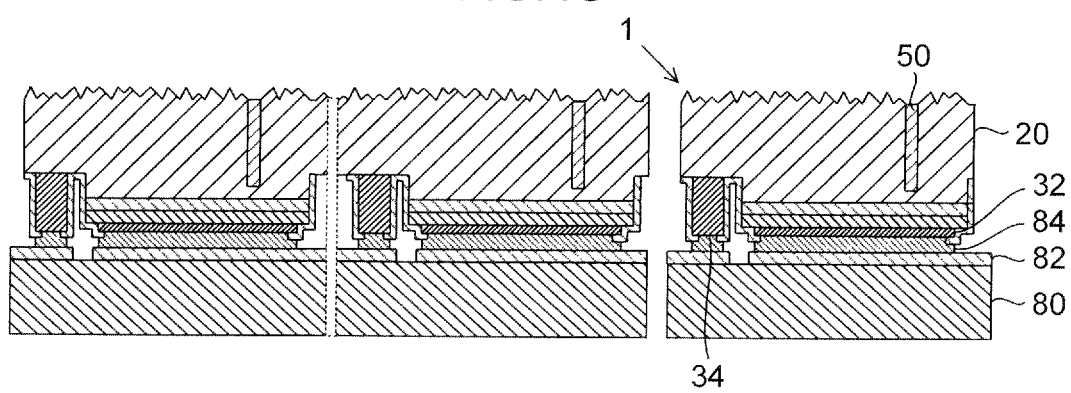

Next, the manufacturing method of the semiconductor light emitting device 1 having the above configuration will be described below with reference to FIGS. 3 and 4. FIGS. 3A to 3D and FIGS. 4A to 4C are cross-sectional views showing process steps in the production process of the semiconductor light emitting device 1.

(Formation of the Semiconductor Film)

For example, a C-plane sapphire substrate on which a semiconductor film made of $Al_xIn_yGa_zN$ ($0 \leq x \leq 1$, $0 \leq y \leq 1$, $0 \leq z \leq 1$, $x+y+z=1$) can be grown by a metal organic chemical vapor deposition (MOCVD) method is used as the growth substrate. The semiconductor film 20 including the n-type semiconductor layer 22, the active layer 24, and the p-type semiconductor layer 26 is formed on the growth substrate 10.

The n-type semiconductor layer 22 is formed by laying one over another a low-temperature buffer layer, an underlying GaN layer, and a Si-doped n-type GaN layer on the growth substrate 10. Specifically, the growth substrate 10 is placed in an MOCVD apparatus, and heating for about 10 minutes is performed in a hydrogen atmosphere at a substrate temperature of about 1,000° C. (thermal cleaning). Then, the substrate temperature (growth temperature) is adjusted to about 500° C., and TMG (trimethylgallium) (flow rate: 10.4 μmol/min) and $NH_3$ (flow rate: 3.3 LM) are supplied for about 3 minutes, thereby forming the low-temperature buffer layer made of GaN. Then, the substrate temperature (growth temperature) is raised to 1,000° C. and maintained for about 30 seconds to crystallize the low-temperature buffer layer. Subsequently, with the substrate temperature (growth temperature) kept at 1,000° C., TMG (flow rate: 45 μmol/min) and $NH_3$ (flow rate: 4.4 LM) are supplied for about 20 minutes, thereby forming the underlying GaN layer of about 1 μm thickness. Then, at a substrate temperature (growth temperature) of 1,000° C., TMG (flow rate: 45 μmol/min), $NH_3$ (flow rate: 4.4 LM), and $SiH_4$ as dopant gas (flow rate: $2.7 \times 10^{-9}$ μmol/min) are supplied for about 90 minutes, thereby forming the n-type GaN layer of about 6 μm thickness. By undergoing the above steps, the n-type semiconductor layer 22 is formed on the growth substrate 10.

Subsequently, the active layer 24 is formed on the n-type semiconductor layer 22. In the present embodiment, a multi-quantum well structure of InGaN/GaN is applied to the active layer 24. With InGaN/GaN as a period, five periods of growth is performed. Specifically, at a substrate temperature (growth temperature) of 700° C., TMG (flow rate: 3.6 μmol/min), TMI (trimethylindium) (flow rate: 10 μmol/min), and $NH_3$ (flow rate: 4.4 LM) are supplied for about 33 seconds, thereby forming an InGaN well layer of about 2.2 nm thickness. Then, TMG (flow rate: 3.6 μmol/min) and $NH_3$ (flow rate: 4.4 LM) are supplied for about 320 seconds, thereby forming a GaN barrier layer of about 15 nm thickness. By repeating this process five periods, the active layer 24 is formed.

The p-type semiconductor layer 26 is formed by laying one over the other a p-type AlGaN clad layer and a Mg-doped p-type GaN layer. Specifically, subsequent to the preceding step, the substrate temperature (growth temperature) is raised to 870° C., and TMG (flow rate: 8.1 μmol/min), TMA (trimethylaluminum) (flow rate: 7.5 μmol/min), $NH_3$ (flow rate: 4.4 LM), and $CP_2Mg$ (bis-cyclopentadienyl Mg) as a dopant (flow rate: $2.9 \times 10^{-7}$ μmol/min) are supplied for about 5 minutes, thereby forming the p-type AlGaN clad layer of about 40 nm thickness. Subsequently, with maintaining the substrate temperature (growth temperature), TMG (flow rate: 18 μmol/min), NH$_3$ (flow rate: 4.4 LM), and CP$_2$Mg as a dopant (flow rate: 2.9×10$^{-7}$ μmol/min) are supplied for about 7 minutes, thereby forming the p-type GaN layer of about 150 nm thickness. By undergoing the above steps, the p-type semiconductor layer 26 is formed on the surface of the active layer 24 (FIG. 3A).

(Formation of Recesses)

The semiconductor film 20 is etched from the surface side of the p-type semiconductor layer 26 to form recesses 20a so as to make the n-type semiconductor layer 22 partially exposed at the bottoms of the recesses 20a. Specifically, a resist mask having openings corresponding to the forming regions for the recesses 20a is formed on the surface of the p-type semiconductor layer 26 by photolithography. Then, the wafer is put in a reactive ion etching (RIE) apparatus, and the semiconductor film 20 is etched down by about 500 nm from the surface side of the p-type semiconductor layer 26 to make the n-type semiconductor layer 22 partially exposed (FIG. 3B).

(Electrode Formation)

The p-electrode 32 and the n-electrode 34 are formed respectively on the surface of the p-type semiconductor layer 26 and on the surface of the n-type semiconductor layer 22 partially exposed at the bottom of the recess 20a formed in the previous process step. Specifically, a resist mask having openings corresponding to the forming regions for the n-electrodes is formed on the semiconductor film 20 by photolithography. Then, Ti (1 nm), Al (1,000 nm), Ti (1 nm), and Au (500 nm) are sequentially deposited by an electron beam evaporation method, and the resist mask is removed, thereby forming the n-electrodes 34. Likewise, a resist mask having openings corresponding to the forming regions for the p-electrodes is formed on the semiconductor film 20, and after Pt (10 nm), Ag (300 nm), Ti (1 nm), and Au (500 nm) are sequentially deposited, the resist mask is removed, thereby forming the p-electrodes 32.

Note that after a resist mask having openings corresponding to the forming regions for the p-electrodes 32 and the n-electrodes 34 is formed on the semiconductor film 20, electrode materials may be deposited to form the p-electrodes 32 and the n-electrodes 34 at the same time. The electrode material-film formation can be performed also by a sputtering method, a magnetron sputtering method, an arc discharge ion plating method, or a plating method, not being limited to the electron beam evaporation method. Especially, in order to reduce the contact resistance of the p-electrodes 32 with the semiconductor film 20, after a transparent oxide conductive film of ITO, IZO, or the like is formed on the p-type semiconductor layer 26, the above metal film may be formed.

Then, the end surfaces of the semiconductor film 20 exposed by forming the recesses 20a, and the side surfaces and partially the upper surfaces of the p-electrodes 32 and of the n-electrodes 34 are covered with the protective film 40 made of an insulator such as SiO$_2$. Specifically, a SiO$_2$ film of about 300 nm thickness is formed over the semiconductor film 20 by a sputtering method or the like, and a resist mask is formed on the SiO$_2$ film by photolithography, and then the SiO$_2$ film is partially removed by wet etching, thereby forming the protective film 40 (FIG. 3C). The protective film 40 may be constituted by a film of another insulator such as Si$_3$N$_4$ or TaN, not being limited to SiO$_2$. Further, the insulator forming the protective film 40 can be formed also by the electron beam evaporation method or a CVD method.

(Bonding of the Support Substrate)

The support substrate 80 having the conductor lines 82 on its surface is prepared. The support substrate 80 is constituted by an insulator having no impurity doped therein such as Si or Ge, or a semiconductor or conductor having an insulating process performed on its surface. The conductor lines 82 are made of, e.g., Au, which is good in adhesion to solder material 84. The solder material 84 of AuSn is applied onto the surfaces of the conductor lines 82 by a resistance heating evaporation method or the like. Then, with the conductor lines 82 being in close contact with the p-electrodes 32 and the n-electrodes 34, the support substrate 80 is thermal-compression bonded to the semiconductor film 20 (FIG. 3D). If the mechanical strength of the semiconductor film 20 is secured, this process step can be omitted. For example, if the semiconductor film 20 is made to have a thickness of, e.g., 80 μm or greater by forming the n-type semiconductor layer 22 to be thicker, or if crystal growth is performed using n-type GaN as the growth substrate with the removal process of the growth substrate described later being omitted, or if the p-electrodes 32 and the n-electrodes 34 are made to have a thickness of, e.g., 100 μm or greater by performing Cu or Ni plating on the surfaces of both the electrodes, then the support substrate does not need to be used.

(Removal of the Growth Substrate)

The growth substrate 10 is removed by a laser lift-off method or the like to make the n-type semiconductor layer 22 exposed. Specifically, an excimer laser is irradiated from the back side of the growth substrate 10. The irradiated laser reaches the semiconductor film 20 and decomposes GaN adjacent to the interface with the growth substrate 10 into metal Ga and N$_2$ gas. By this means, a gap is formed between the growth substrate 10 and the semiconductor film 20, and thereby the growth substrate 10 is separated from the semiconductor film 20. By this removal of the growth substrate 10, the n-type semiconductor layer 22 is exposed. By treating the surface of the n-type semiconductor layer 22 exposed by the removal of the growth substrate 10 with an alkali solution such as a KOH solution or a TMAH solution, irregularities to improve light extraction efficiency may be formed in the surface of the n-type semiconductor layer 22 (FIG. 4A).

(Formation of the Current Guide Portion)

The current guide portions 50 are formed in the n-type semiconductor layer 22. Specifically, a resist mask having openings corresponding to the forming regions for the current guide portions is formed on the surface of the n-type semiconductor layer 22 exposed by the removal of the growth substrate 10. Then, the wafer is put in an RIE apparatus, and the n-type semiconductor layer 22 is etched to make grooves of, e.g., 3 μm width and 6.5 μm depth, which do not reach the active layer 24. The distance from the end of the groove to the active layer 24 is, for example, 0.5 μm or less. Then, a conductor such as Ti or Al is filled inside the groove by the electron beam evaporation method or the like. Then, the resist mask is removed (FIG. 4B). The width of the groove is preferably 1 μm or greater and 15 μm or less. If the width of the groove is 1 μm or less, it will be difficult to fill a conductor inside the groove. In contrast, if the width of the groove is 15 μm or greater, the area of the current guide portion 50 that blocks light emitted from the active layer 24 is large, and thus light extraction efficiency is reduced. The depth of the groove should be set as needed taking into account the amount of current flowing via the current guide portion 50. The groove can be made also by wet etching using an alkali solution, or wet etching and dry etching in combination. The current guide portion 50 should be made of material having higher conductivity than the n-type semiconductor layer 22, and, for example, the same material as the electrode material can be used for it. Or, the current guide portion 50 may be formed of a transparent conductive oxide such as ITO or IZO. In this case, after ITO or IZO is filled inside the groove by a sputtering method or the like, heat treatment is performed in an oxygen or nitrogen atmosphere at 600° C. for about one minute to make the ITO or IZO be in ohmic contact with the n-type semiconductor layer 22. By making the current guide portion 50 of a transparent conductive oxide, light emitted from the active layer 24 can be extracted outside without being blocked. Or, the current guide portion 50 may be formed, without making the groove in the semiconductor film 20, by forming a conductive film on the exposed surface of the n-type semiconductor layer 22.

(Dividing of the Semiconductor Film)

The semiconductor film 20 and the support substrate 80 are cut and divided into chips of semiconductor light emitting devices. Specifically, a resist mask having openings along element division lines is formed on the surface of the n-type semiconductor layer 22, and the semiconductor film 20 is etched along the element division lines by dry etching, wet etching, or these in combination. Then, the conductor lines 82 are scribed along the element division lines by laser scribing as needed, and the support substrate 80 is cut by dicing (FIG. 4C). By undergoing the above process steps, the semiconductor light emitting device 1 is finished.

Embodiment 2

Figure 5A:
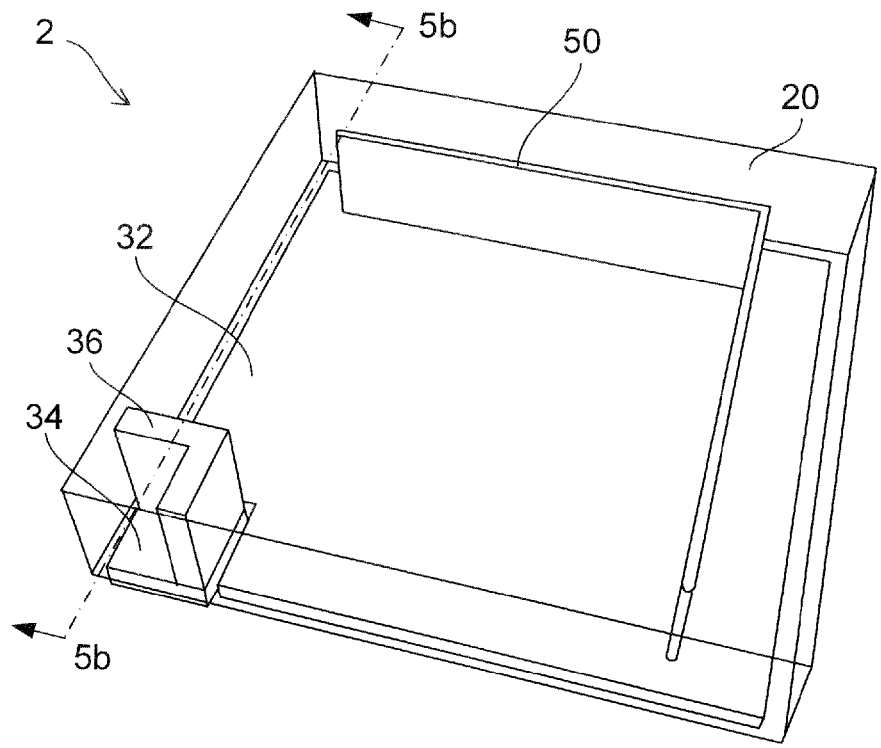
FIG. 5A is a perspective view showing the configuration of a semiconductor light emitting device according to Embodiment 2 of the present invention.
Figure 5B:
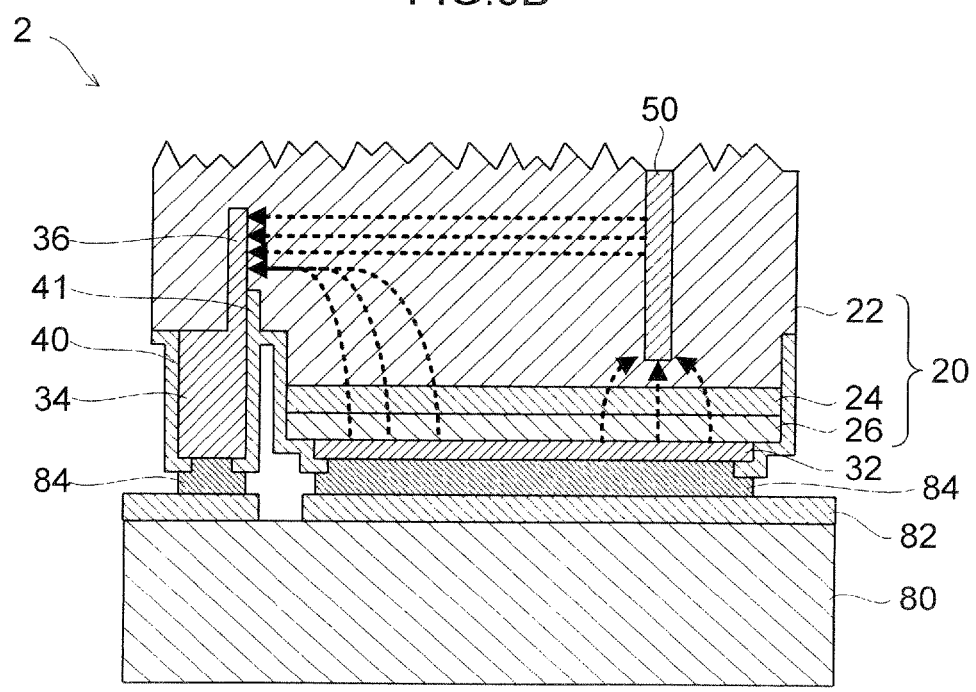
FIG. 5B is a cross-sectional view taken along line 5b-5b in FIG. 5A.

FIG. 5A is a perspective view showing the internal structure of a semiconductor light emitting device 2 according to Embodiment 2 of the present invention, and FIG. 5B is a cross-sectional view taken along line 5b-5b in FIG. 5A. Note that FIG. 5B shows a state where the semiconductor light emitting device 2 is mounted on the support substrate 80 having conductor lines 82 thereon. Points in which the semiconductor light emitting device 2 differs from the semiconductor light emitting device according to the above embodiment 1 will be described below.

In the semiconductor light emitting device 2, the n-electrode 34 has a buried portion 36 buried in the n-type semiconductor layer 22. The buried portion 36 is constituted by a conductor having conductivity higher than that of the n-type semiconductor layer 22. The buried portion 36 is made of, e.g., the same metal as the n-electrode 34 and formed integrally with the n-electrode 34. As shown in FIG. 5A, the buried portion 36 extends in the lamination direction of the semiconductor film 20 and in the direction (lateral direction) parallel to the principal surface and forms an opposite surface facing the current guide portion 50 in the n-type semiconductor layer 22. It is preferable that the distance between the buried portion 36 and the current guide portion 50 is substantially the same, that is, the opposite surfaces of the buried portion 36 and of the current guide portion 50 are parallel to each other. Note that the buried portion 36 may terminate in the n-type semiconductor layer 22 or extend through the n-type semiconductor layer 22.

In FIG. 5B, current flowing through the semiconductor film 20 is indicated by broken lines. Current injected from the p-electrode 32 into the semiconductor film 20 flows directly toward the n-electrode 34 from the p-electrode 32 at regions near the n-electrode 34. Meanwhile, at regions relatively far from the n-electrode 34, current flows toward the n-electrode 34 via the current guide portion 50 higher in conductivity than the n-type semiconductor layer 22. The current is introduced into the n-electrode 34 through the entire surface of the buried portion 36 facing the current guide portion 50. By providing the n-electrode 34 with the buried portion 36, the contact area between the n-electrode 34 and the n-type semiconductor layer 22 can be enlarged without enlarging the area of removed part of the active layer 24. That in the semiconductor light emitting device according to this embodiment, the area of the n-electrode can be secured at no expense of the area of the light emitting portion. As a result, local current constriction at the n-electrode 34 can be alleviated, thus improving the reliability of the semiconductor light emitting device. Further, because the buried portion 36 and the current guide portion 50 are made of material of high conductivity, internal potential is substantially the same across their regions, so that there is almost no potential difference along the lamination direction of the semiconductor film 20. Hence, current flows dispersed uniformly between the opposite surfaces of the buried portion 36 and of the current guide portion 50. Thus, current spread in the lamination direction of the semiconductor film 20 is further promoted, so that a further reduction in the forward voltage can be achieved.

Moreover, as shown in FIG. 5B, by covering part of the surface of the buried portion 36 facing the current guide portion 50 with an insulating film 41, the shortest distance between the p-electrode 32 and the n-electrode 34 becomes longer. By this means, current flowing from the p-electrode 32 directly toward the n-electrode 34 can be led to the current guide portion 50, so that current density around the current guide portion 50 can be made higher. As the area of the buried portion 36 covered by the insulating film 41 becomes larger, the amount of current led to the current guide portion 50 increases. The insulating film 41 may be formed integrally with the protective film 40 covering the side surfaces of the semiconductor film 20 and the side surfaces of both the electrodes 32 and 34.

The buried portion 36 can be formed by, e.g., the following method. After the recesses 20a are formed in the semiconductor film 20 (FIG. 3B), by further etching the bottoms of the recesses 20a, grooves corresponding to the buried portions 36 are formed. Then, a conductor is deposited to fill these grooves, thereby forming the n-electrodes 34 having the buried portions 36.

Embodiment 3

Figure 6A:
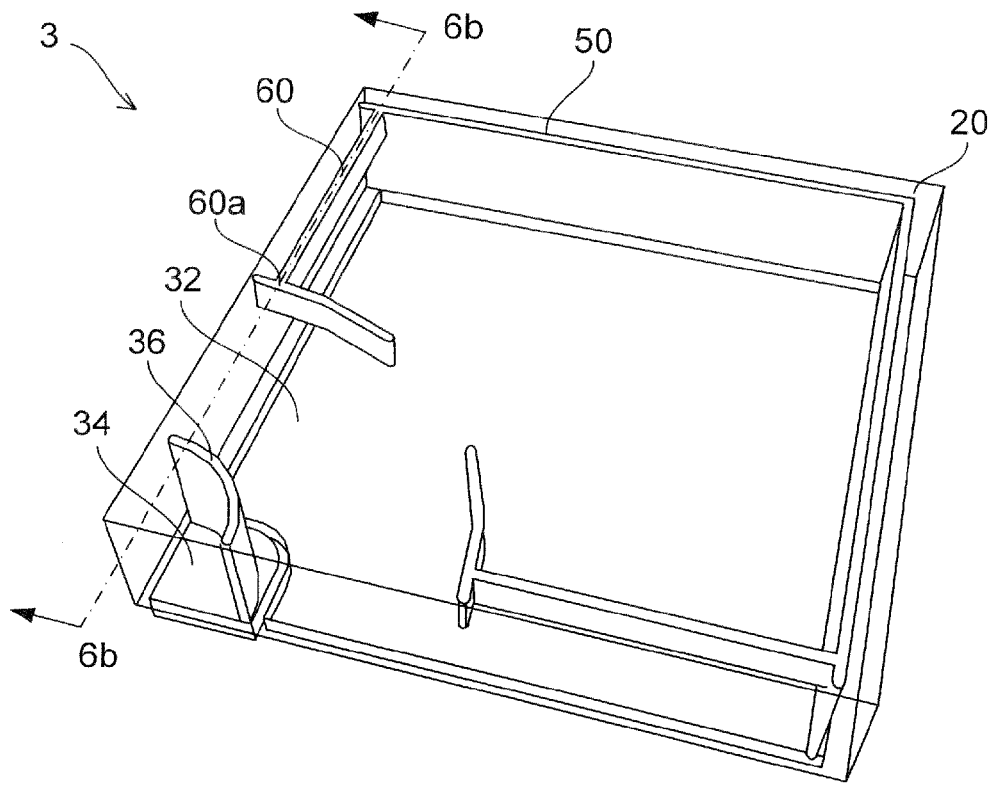
FIG. 6A is a perspective view showing the configuration of a semiconductor light emitting device according to Embodiment 3 of the present invention.
Figure 6B:
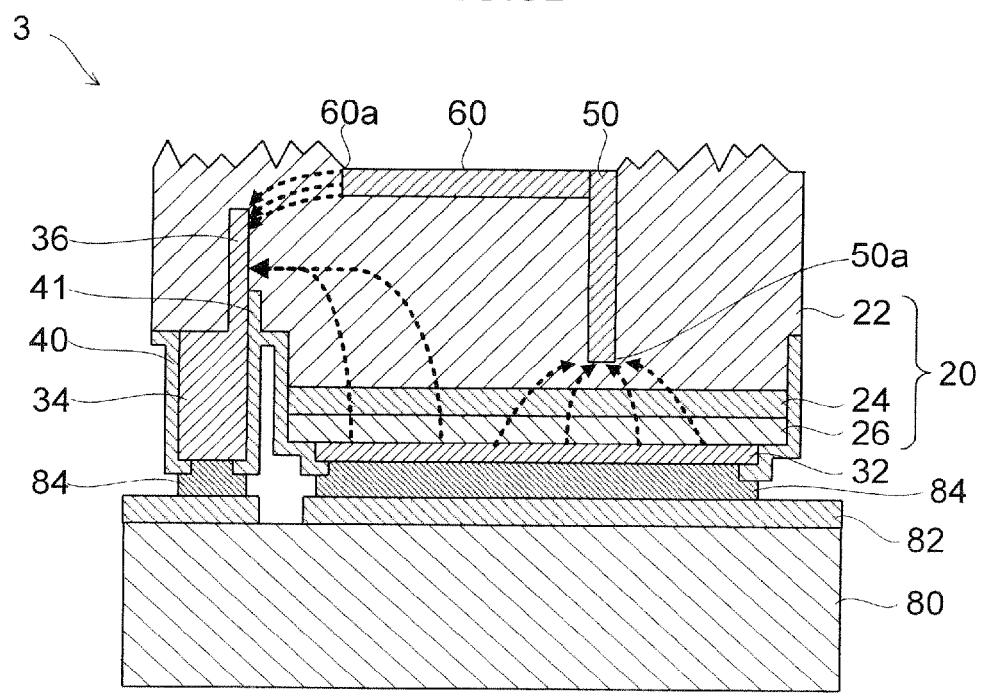
FIG. 6B is a cross-sectional view taken along line 6b-6b in FIG. 6A.

FIG. 6A is a perspective view showing the internal structure of a semiconductor light emitting device 3 according to Embodiment 3 of the present invention, and FIG. 6B is a cross-sectional view taken along line 6b-6b in FIG. 6A. Note that FIG. 6B shows a state where the semiconductor light emitting device 3 is mounted on the support substrate 80 having conductor lines 82 thereon. Points in which the semiconductor light emitting device 3 differs from the semiconductor light emitting devices according to the above embodiments 1 and 2 will be described below.

The semiconductor light emitting device 3 has an extension portion 60 connected to the current guide portion 50 and extending along the principal surface of the semiconductor film 20 toward the n-electrode 34. That is, the end 60a of the extension portion 60 is located near the n-electrode 34 or the buried portion 36. The extension portion 60 is constituted by a conductor having conductivity higher than that of the n-type semiconductor layer 22. The extension portion 60 may be made of the same material as that of the current guide portion 50 or a different material. Further, the extension portion 60 may be formed on the surface of the n-type semiconductor layer 22 that is the light emitting surface or buried in the n-type semiconductor layer 22. Where the extension portion 60 is buried in the n-type semiconductor layer 22, the edge of the extension portion 60 in the lamination direction of the semiconductor film 20 is preferably at a shallower position (i.e., on the light emitting surface side) than the end 50a of the current guide portion 50. This is because, if the extension portion 60 reaches down near the p-electrode 32, current may be constricted into the extension portion 60, thus making the light emission brightness distribution non-uniform.

In FIG. 6B, current flowing through the semiconductor film 20 is indicated by broken lines. Current injected from the p-electrode 32 into the semiconductor film 20 flows directly toward the n-electrode 34 from the p-electrode 32 at regions near the n-electrode 34. Meanwhile, at regions relatively far from the n-electrode 34, current flows via the current guide portion 50 and the extension portion 60 higher in conductivity than the n-type semiconductor layer 22 and out of the end 60a of the extension portion toward the n-electrode 34. Because the extension portion 60 extends to near the n-electrode 34 or the buried portion 36, the electric resistance of the path via the current guide portion 50 and the extension portion 60 to the n-electrode 34 is greatly reduced. Thus, the region having smaller electric resistance across it to the n-electrode 34 is made larger in the path via the current guide portion 50 than in the path directly toward the n-electrode 34, and hence current can be led from a wider area to the current guide portion 50, resulting in an increase in the current density near the current guide portion 50. That is, by providing the extension portion 60, the current guide function of the current guide portion 50 can be enhanced, and current spread in the semiconductor film 20 can be promoted. Further, because the distance across which current passes in the semiconductor film relatively high in electric resistance becomes shorter, the forward voltage can be further reduced.

The extension portion 60 may be made up of a plurality of segments connected to a plurality of places of the current guide portion 50. By this means, the current path is divided, thus alleviating current constriction. In this case, in order to prevent the lopsidedness of the current density distribution, the distance from the end 60a of each segment to the n-electrode 34 or the buried portion 36 is preferably the same. Further, the end 60a of the extension portion 60 may be elongated such that an opposite surface facing the buried portion 36 in parallel is formed at the end 60a as shown in FIG. 6A. By this means, current is dispersed at the end 60a, thus alleviating current constriction. Yet further, by forming them such that while the current guide portion 50 is in ohmic contact with the n-type semiconductor layer 22, the extension portion 60 is in non-ohmic contact with it, the amount of current led into the extension portion 60 from the semiconductor film 20, not via the current guide portion 50 can be suppressed. That is, the division of roles is emphasized where the current guide portion 50 attracts current injected from the p-electrode 32 into the semiconductor film 20, while the extension portion 60 leads the current led into the current guide portion 50 toward the n-electrode 34. Thus, the extension portion 60 can be made to extend deeper in the semiconductor film 20, so that degrees of freedom in designing the semiconductor light emitting device can be increased. Although in the above embodiment description has been made taking as an example the case where the n-electrode 34 has the buried portion 36, also in the case where the n-electrode 34 does not have the buried portion 36, the same effect can be obtained.

The extension portion 60 can be formed by, e.g., the following method. Before or after grooves for forming the current guide portions 50 are formed in the semiconductor film 20, by etching the forming regions for the extension portions in the semiconductor film 20, grooves of, e.g., 2 μm depth are formed. Then, a conductor is filled in the grooves for forming the current guide portions 50 and the extension portions 60 by the electron beam evaporation method or the like to form the current guide portions 50 and the extension portions 60 at the same time. Or, in order to make the contact between the extension portion 60 and the n-type semiconductor layer 22 non-ohmic as mentioned above, the extension portion 60 is made to be formed of, e.g., a transparent oxide conductor such as ITO or IZO. By not performing heat treatment (sintering) on the transparent oxide conductor after film formation, which is usually performed, the extension portion 60 in non-ohmic contact with the n-type semiconductor layer 22 can be formed. By making the extension portion 60 of a transparent oxide conductor, light emitted from the active layer 24 can be extracted outside without being blocked.

Embodiment 4

Figure 7A:
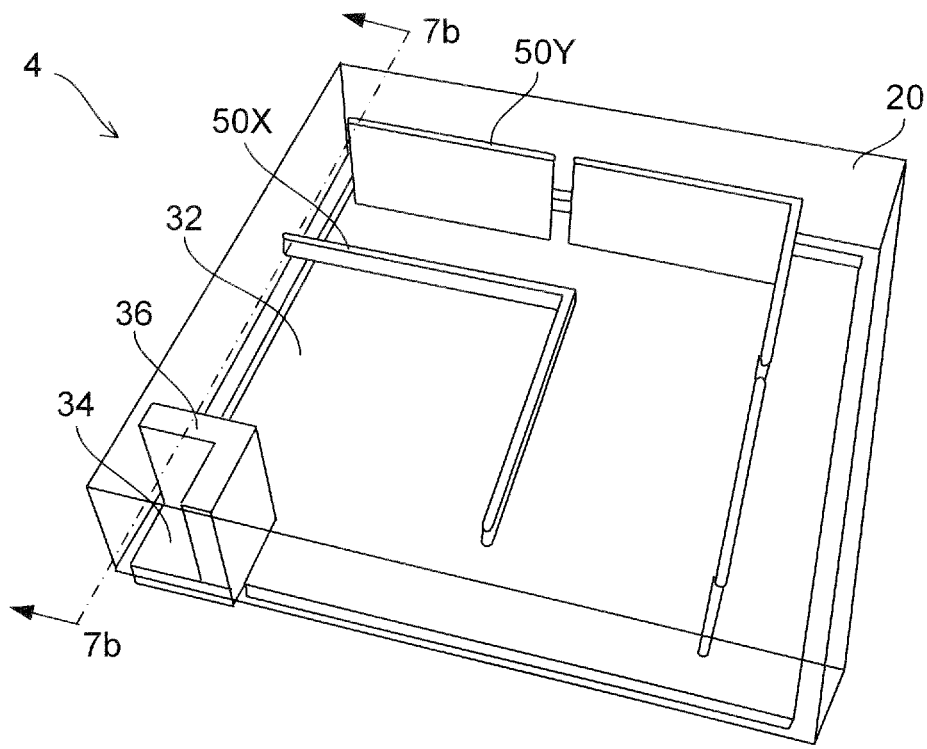
FIG. 7A is a perspective view showing the configuration of a semiconductor light emitting device according to Embodiment 4 of the present invention.
Figure 7B:
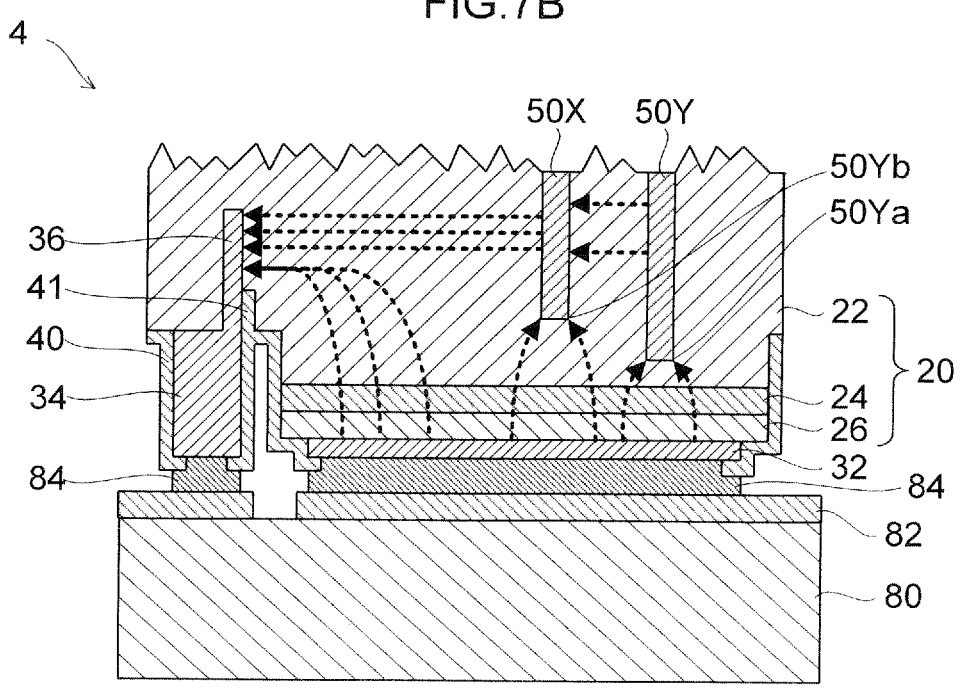
FIG. 7B is a cross-sectional view taken along line 7b-7b in FIG. 7A.

FIG. 7A is a perspective view showing the internal structure of a semiconductor light emitting device 4 according to Embodiment 4 of the present invention, and FIG. 7B is a cross-sectional view taken along line 7b-7b in FIG. 7A. Note that FIG. 7B shows a state where the semiconductor light emitting device 4 is mounted on the support substrate 80 having conductor lines 82 thereon. Points in which the semiconductor light emitting device 4 differs from the semiconductor light emitting devices according to the above embodiments 1 to 3 will be described below.

The semiconductor light emitting device 4 has current guide portions 50X and 50Y buried at positions different in their distance from the n-electrode 34 in the n-type semiconductor layer 22. The current guide portions 50X and 50Y extend from the surface of the n-type semiconductor layer 22 that is the light emitting surface of the semiconductor light emitting device 4 in the lamination direction of the semiconductor film 20 and terminate at depths not reaching the active layer 24 and the p-type semiconductor layer 26. The end 50Ya of the current guide portion 50Y placed at a position farther from the n-electrode 34 reaches a depth position closer to the active layer 24 than the end 50Xa of the current guide portion 50X placed at a position closer to the n-electrode 34. The current guide portions 50X and 50Y are both provided, in a direction parallel to the principal surface of the semiconductor film 20, over the p-electrode 32 exclusively on its end side far from the n-electrode 34.

In FIG. 7B, current flowing through the semiconductor film 20 is indicated by broken lines. Current injected from the p-electrode 32 into the semiconductor film 20 flows directly toward the n-electrode 34 from the p-electrode 32 at regions near the n-electrode 34. Meanwhile, at regions relatively far from the n-electrode 34, current flows toward the n-electrode 34 via the current guide portions 50X and 50Y higher in conductivity than the n-type semiconductor layer 22. By making the end 50Ya of the current guide portion 50Y placed at a position farther from the n-electrode 34 be closer to the p-electrode 32 as mentioned above, current spread in the semiconductor film 20 is promoted, so that the current density can be made uniform. If the end 50Xa of the current guide portion 50X placed at a position closer to the n-electrode 34 is made closer to the p-electrode 32 than the end 50Ya of the current guide portion 50Y, the amount of current led into the current guide portion 50X increases while the amount of current led into the current guide portion 50Y decreases, so that the current density in the semiconductor film 20 becomes non-uniform.

Further, as shown in FIG. 7A, the current guide portions 50X and 50Y preferably extend also in the direction (lateral direction) parallel to the principal surface of the semiconductor film 20. By this means, the current spread across the wide area of the semiconductor film 20 can be promoted, and thus the effective area of the light emitting portion can be enlarged and the luminous efficiency can be improved. In this case, by making the extending direction of the current guide portions 50X and 50Y be parallel to the outer side edge of the n-electrode 34 or the buried portion 36, potential becomes uniform across the parts of each of the current guide portions 50X and 50Y, and thus the lopsidedness of the current density distribution in the semiconductor film 20 can be reduced. Note that the current guide portions 50X and 50Y extending in the direction (lateral direction) parallel to the principal surface of the semiconductor film 20 may be discontinuous along the extending direction. That is, the current guide portions 50X and 50Y may be divided into a plurality of segments along the direction parallel to the principal surface of the semiconductor film 20. By this means, the areas of the current guide portions 50X and 50Y that block light emitted from the active layer 24 are made smaller, and thus the light extraction efficiency can be improved.

The current guide portions 50X and 50Y can be formed by, e.g., the following method. After the removal of the growth substrate 10 (FIG. 4A), a resist mask having openings corresponding to the forming regions for the current guide portions 50X is formed on the exposed surface of the n-type semiconductor layer 22, and grooves of, e.g., 6 μm depth are formed in the n-type semiconductor layer 22 by reactive ion etching (RIE). Then, a conductor is filled in the grooves by the electron beam evaporation method or the like, and the resist mask is removed, thereby forming the current guide portions 50X. Then, a resist mask having openings corresponding to the forming regions for the current guide portions 50Y is formed on the exposed surface of the n-type semiconductor layer 22, and grooves of, e.g., 2 μm depth are formed in the n-type semiconductor layer 22 by reactive ion etching (RIE). Then, a conductor is filled in the grooves by the electron beam evaporation method or the like, and the resist mask is removed, thereby forming the current guide portions 50Y. Note that grooves for forming the current guide portions 50X and 50Y may be formed in the n-type semiconductor layer 22 beforehand, and that a conductor may be filled in these grooves at the same time, thereby forming the current guide portions 50X and 50Y at the same time.

Embodiment 5

Figure 8A:
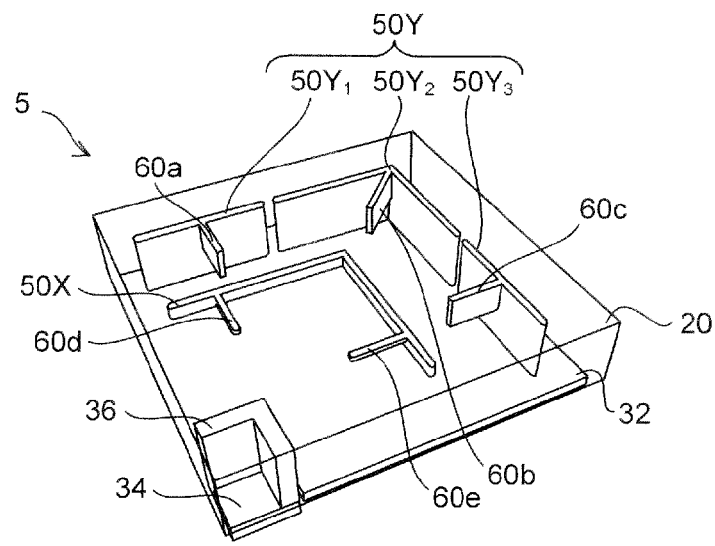
FIGS. 8A to 8C are perspective views showing the configurations of semiconductor light emitting devices according to Embodiment 5 of the present invention.
Figure 8B:
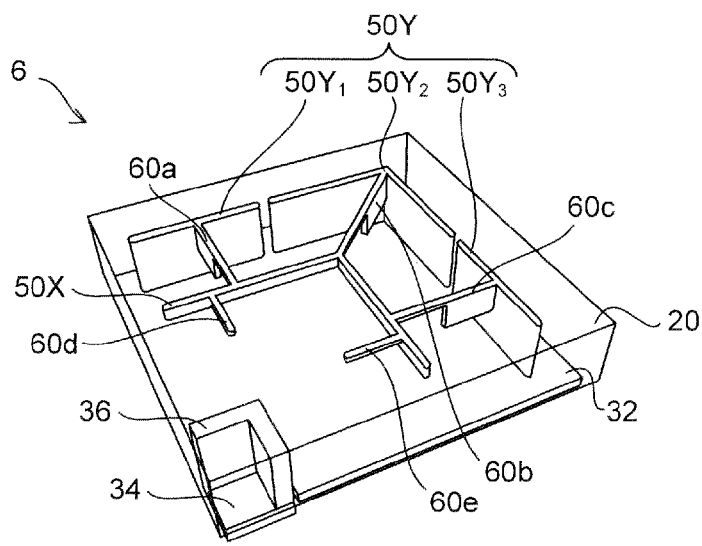
Figure 8C:
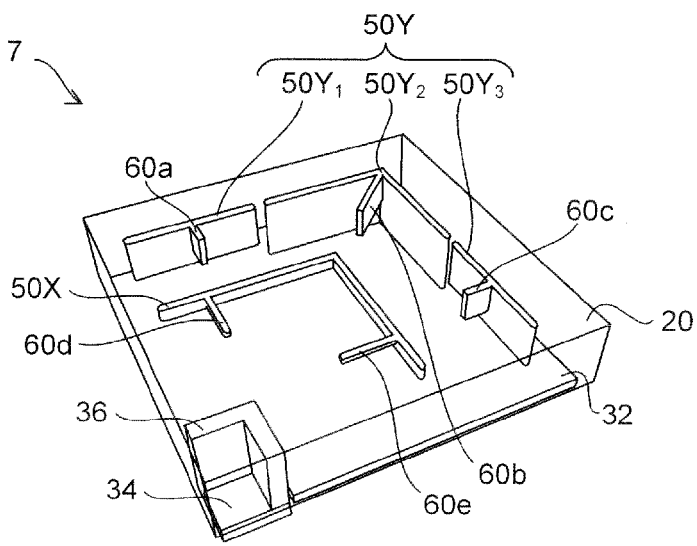

FIGS. 8A to 8C are perspective views showing the internal structures of semiconductor light emitting devices 5 to 7 according to Embodiment 5 of the present invention. The semiconductor light emitting devices 5 to 7 are combinations of the semiconductor light emitting devices according to the above embodiments 1 to 4 in configuration.

The semiconductor light emitting devices 5 to 7 each have current guide portions 50X and 50Y placed at positions different in their distance from the n-electrode 34. Extension portions 60a to 60e extending along the principal surface of the semiconductor film 20 toward the n-electrode 34 are connected to the current guide portions 50X and 50Y. The current guide portion 50Y placed at a position farther from the n-electrode 34 extends to a position closer to the active layer 24 in the semiconductor film 20 than the current guide portion 50X placed at a position closer to the n-electrode 34. The n-electrode 34 has the buried portion 36 buried in the semiconductor film 20. The current guide portion 50Y is divided into a plurality of segments $50Y_1$ to $50Y_3$ along the extending direction parallel to the principal surface of the semiconductor film 20.

In the semiconductor light emitting device 5, the segments $50Y_1$ to $50Y_3$ of the current guide portion 50Y terminate at the same depth position in the n-type semiconductor layer 22. The extension portions 60a to 60c connected to the segments $50Y_1$ to $50Y_3$ are of the same length in the extending direction.

In the semiconductor light emitting device 6, the extension portions 60a to 60c connected to the segments $50Y_1$ to $50Y_3$ of the current guide portion 50Y are connected to the current guide portion 50X. That is, the current guide portions 50X and 50Y are electrically connected via the extension portions 60a to 60c. Hence, the potentials on the current guide portions 50X and 50Y can be substantially the same, and the current guide function of the current guide portion 50Y placed at a position farther from the n-electrode 34 can be enhanced.

In the semiconductor light emitting device 7, the segment $50Y_2$ placed in a corner extends to a depth position closer to the active layer 24 than the other two segments $50Y_1$ and $50Y_3$. The extension portion 60b connected to the segment $50Y_2$ is longer in the extending direction length than the extension portions 60a and 60c respectively connected to the other two segments $50Y_1$ and $50Y_3$. By this means, the current guide function of the segment $50Y_2$ can be further enhanced than that of the other two segments $50Y_1$ and $50Y_3$. The distance to the n-electrode 34 is longer for the segment $50Y_2$ than for the other two segments $50Y_1$ and $50Y_3$. Where due to this the current density is smaller near the segment $50Y_2$ than near the other regions, by relatively enhancing the current guide function of the segment $50Y_2$, as described above, current spread in the semiconductor film 20 is promoted, so that the current density can be made uniform.

Embodiment 6

Figure 9A:
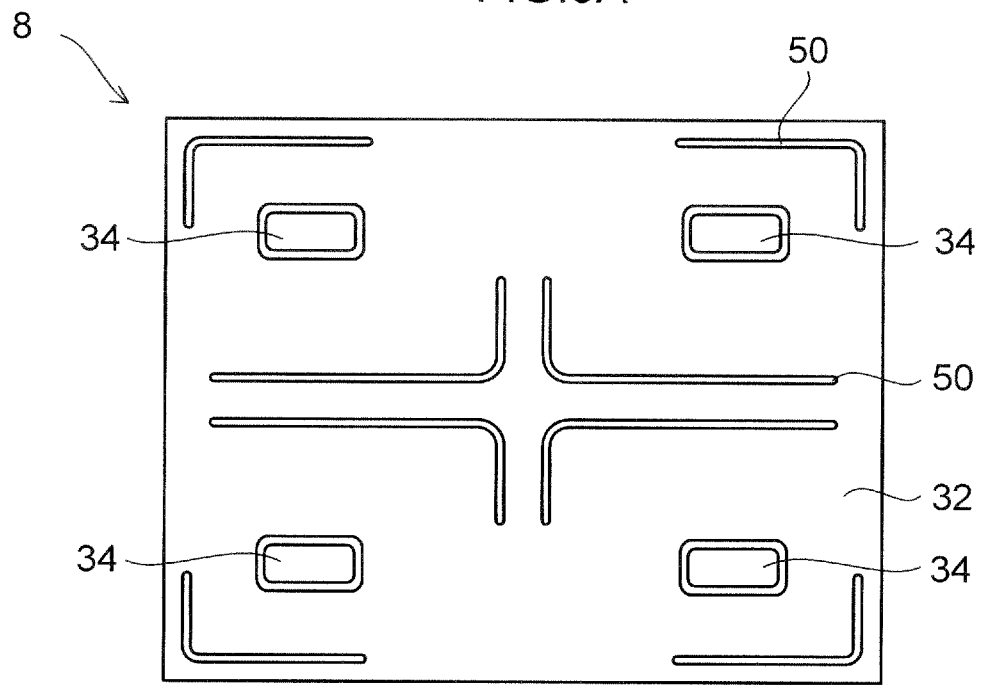
FIGS. 9A and 9B are plan views showing the configuration of a semiconductor light emitting device according to Embodiment 6 of the present invention.
Figure 9B:
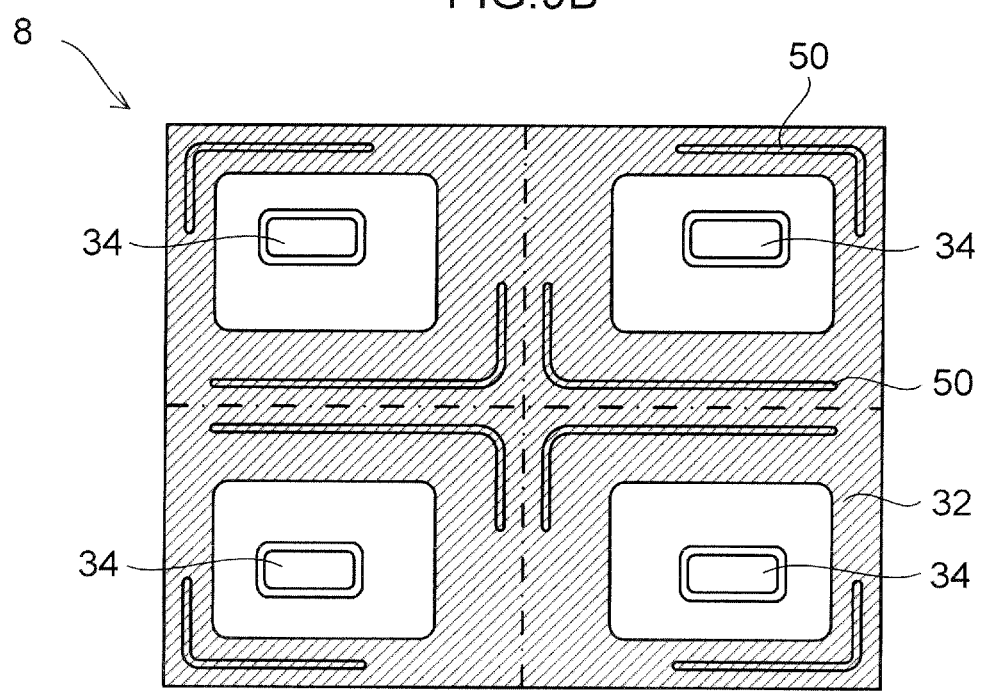
Figure 10A:
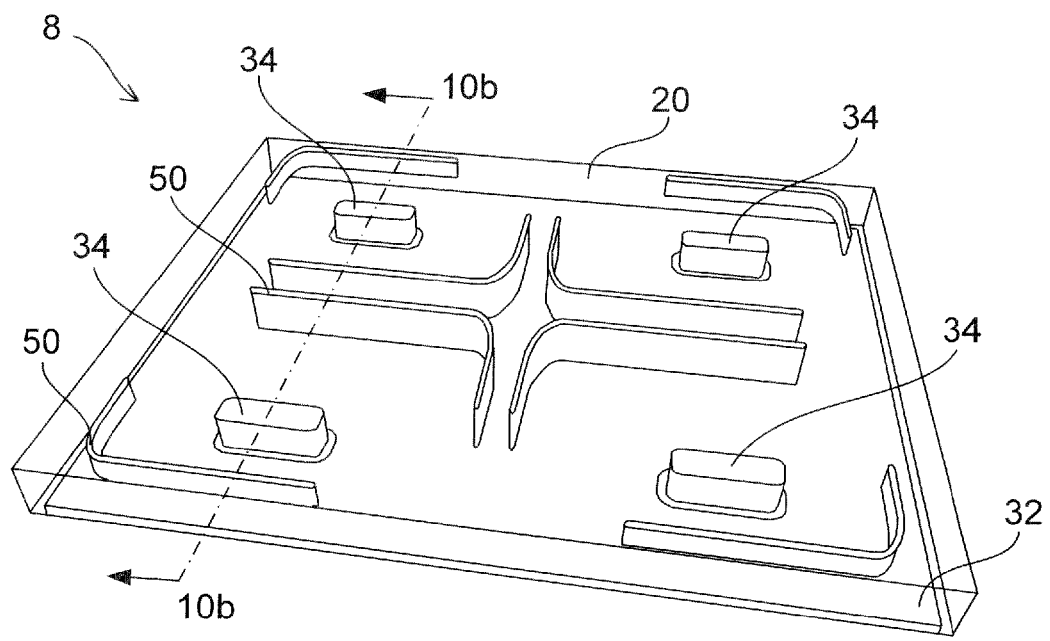
FIG. 10A is a perspective view showing the configuration of the semiconductor light emitting device according to Embodiment 6 of the present invention.
Figure 10B:
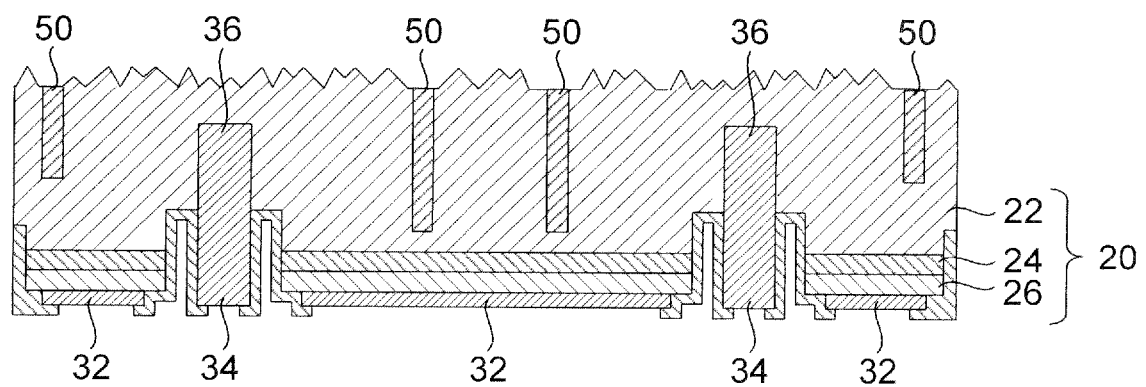
FIG. 10B is a cross-sectional view taken along line 10b-10b in FIG. 10A.

FIGS. 9A and 9B are plan views showing the configuration of a semiconductor light emitting device 8 according to Embodiment 6 of the present invention; FIG. 10A is a perspective view showing the internal structure of the semiconductor light emitting device 8; and FIG. 10B is a cross-sectional view taken along line 10b-10b in FIG. 10A. Points in which the semiconductor light emitting device 8 differs from the semiconductor light emitting devices according to the above embodiments 1 to 5 will be described below.

The semiconductor light emitting device 8 has a plurality of n-electrodes 34. The n-electrodes 34 are placed at predetermined intervals in a longitudinal direction and a lateral direction in a plane parallel to the principal surface of the semiconductor film 20. Each n-electrode 34 has a buried portion 36 buried in the n-type semiconductor layer 22. A p-electrode 32 is provided extending around the n-electrode 34. A plurality of current guide portions 50 are provided in the n-type semiconductor layer 22. In order to promote current spread in the semiconductor film 20 so as to make the current density uniform, the current guide portions 50 are preferably placed in the area indicated by hatching in FIG. 9B. That is, the current guide portions 50 are preferably placed exclusively on the side on which there exist the center lines (indicated by dot-dashed lines in FIG. 9B) between adjacent n-electrodes. Current guide portions 50 may be formed along the corners of the semiconductor film 20 as needed. By placing the current guide portions 50 in this way, also in the case of having a plurality of n-electrodes, current spread in the semiconductor film 20 can be promoted, and the current density can be made uniform.

Although in the above embodiments the arrangements, shapes, numbers, materials, forming methods, and so on of the current guide portions 50, the buried portions 36, and the extension portions 60 are described specifically, in order to obtain a good light-emitting characteristic and high reliability, these parameters can be changed or adjusted as needed.

Further, although in the above embodiments description has been made taking as an example the case where irregularities are formed in the surface of the n-type semiconductor layer 22 exposed by removing the growth substrate, the surface of the n-type semiconductor layer 22 may be smooth. If the growth substrate is formed of an n-type semiconductor, the growth substrate does not need to be removed. Further, the present invention can be applied to not only flip-chip-type semiconductor light emitting devices but also so-called face-up-type semiconductor light emitting devices where bonding wires are connected to an n-electrode and a p-electrode formed on the same surface side of the semiconductor film.

This application is based on Japanese Patent Application No. 2010-273843 which is herein incorporated by reference.

What is claimed is:

1. A semiconductor light emitting device which includes a semiconductor film including a first semiconductor layer of a first conductivity type, a second semiconductor layer of a second conductivity type, and an active layer provided between said first semiconductor layer and said second semiconductor layer; a first electrode formed on an exposed surface of said first semiconductor layer exposed by removing parts of said second semiconductor layer, of said active layer, and of said first semiconductor layer from the surface side of said second semiconductor layer; and a second electrode formed on the surface of said second semiconductor layer, said semiconductor light emitting device comprising:
a current guide portion provided in said first semiconductor layer over said second electrode and having a conductivity higher than that of said first semiconductor layer, said current guide portion being disposed in a recess formed in a direction of lamination of semiconductor layers from a surface of said first semiconductor layer,
wherein said first electrode has a buried portion formed of a conductor buried in said first semiconductor layer.

2. A semiconductor light emitting device according to claim 1, wherein said current guide portion is placed exclusively on the far end side of said second electrode from said first electrode.

3. A semiconductor light emitting device according to claim 2, wherein said first electrode has a buried portion formed of a conductor buried in said first semiconductor layer.

4. A semiconductor light emitting device according to claim 3, wherein said buried portion and said current guide portion have opposite surfaces facing each other in said first semiconductor layer.

5. A semiconductor light emitting device according to claim 4, wherein part of said opposite surface of said buried portion is covered by an insulating film.

6. A semiconductor light emitting device according to claim 2, wherein said current guide portion extends parallel to the outer side edge of said first electrode.

7. A semiconductor light emitting device according to claim 1, wherein said current guide portion extends to a position closer to said active layer than the position of the interface between said first semiconductor layer and said first electrode.

8. A semiconductor light emitting device according to claim 7, wherein said first electrode has a buried portion formed of a conductor buried in said first semiconductor layer.

9. A semiconductor light emitting device according to claim 8, wherein said buried portion and said current guide portion have opposite surfaces facing each other in said first semiconductor layer.

10. A semiconductor light emitting device according to claim 9, wherein part of said opposite surface of said buried portion is covered by an insulating film.

11. A semiconductor light emitting device according to claim 7, wherein said current guide portion extends parallel to the outer side edge of said first electrode.

12. A semiconductor light emitting device according to claim 1, wherein said current guide portion is connected to an extension portion having a conductivity higher than that of said first semiconductor layer and extending on or in said first semiconductor layer toward said first electrode.

13. A semiconductor light emitting device according to claim 12, wherein said first electrode has a buried portion formed of a conductor buried in said first semiconductor layer, and said extension portion has a surface opposite said buried portion at its end in an extending direction thereof.

14. A semiconductor light emitting device according to claim 13, wherein said current guide portion is in ohmic contact with said first semiconductor layer, and said extension portion is in non-ohmic contact with said first semiconductor layer.

15. A semiconductor light emitting device according to claim 12, wherein said current guide portion is in ohmic contact with said first semiconductor layer, and said extension portion is in non-ohmic contact with said first semiconductor layer.

16. A semiconductor light emitting device according to claim 1, wherein said buried portion and said current guide portion have opposite surfaces facing each other in said first semiconductor layer.

17. A semiconductor light emitting device according to claim 16, wherein part of said opposite surface of said buried portion is covered by an insulating film.

18. A semiconductor light emitting device according to claim 1, wherein said current guide portion extends parallel to the outer side edge of said first electrode.

* * * * *